(12) United States Patent
Joshi et al.

(10) Patent No.: US 11,386,544 B2
(45) Date of Patent: Jul. 12, 2022

(54) VISUALIZING AND MODELING THERMOMECHANICAL STRESS USING PHOTOLUMINESCENCE

(71) Applicants: Toyota Motor Engineering & Manufacturing North America, Inc., Plano, TX (US); The Ohio State University, Columbus, OH (US)

(72) Inventors: Shailesh N. Joshi, Ann Arbor, MI (US); Umesh Gandhi, Farmington Hills, MI (US); Vishnu Sundaresan, Columbus, OH (US); Vijay Venkatesh, Columbus, OH (US); Srivatsava Krishnan, Columbus, OH (US)

(73) Assignee: TOYOTA MOTOR ENGINEEEING & MANUFACTURING NORTH AMERICA, INC., Plano, TX (US)

( * ) Notice: Subject to any disclaimer, the term of this patent is extended or adjusted under 35 U.S.C. 154(b) by 279 days.

(21) Appl. No.: 16/668,604

(22) Filed: Oct. 30, 2019

(65) Prior Publication Data

US 2021/0133952 A1 May 6, 2021

(51) Int. Cl.
*G06T 7/00* (2017.01)
*H01L 21/67* (2006.01)
(Continued)

(52) U.S. Cl.
CPC ............ *G06T 7/0008* (2013.01); *C09K 11/02* (2013.01); *G01L 1/16* (2013.01); *G01L 1/241* (2013.01);
(Continued)

(58) Field of Classification Search
USPC ........ 382/150, 141; 250/459.1; 73/762, 800; 356/32; 374/57, 46
See application file for complete search history.

(56) References Cited

U.S. PATENT DOCUMENTS

| 5,006,717 | A | * | 4/1991 | Tsutsu | ................... G01N 21/66 250/458.1 |
| 5,227,641 | A | | 7/1993 | Cheng | |

(Continued)

FOREIGN PATENT DOCUMENTS

| JP | 2001068429 A | 3/2004 | |
| WO | WO-0111311 A1 * | 2/2001 | ............... G01L 1/24 |

OTHER PUBLICATIONS

Remelisa Esteves et al., Measurements for stress sensing of composites using tailored piezospectroscopic coatings (https://aip.scitation.org/doi/pdf/10.1063/1.5084964?class=pdf), published May 1, 2019.

(Continued)

*Primary Examiner* — Kathleen Y Dulaney
(74) *Attorney, Agent, or Firm* — Dinsmore & Shohl LLP (57) ABSTRACT

An electronics system may include a substrate, an electronic device bonded to the substrate, a plurality of photoluminescent particles disposed on the electronic device, an illuminator, a sensor, and a control module. The illuminator can illuminate the electronic device. The sensor can capture a first set of positions of the photoluminescent particles on the electronic device when the electronic device is not operating under a load and a second set of positions of the photoluminescent particles when the electronic device is operating under a load. The control module can determine thermomechanical stress on the electronic device based at least in part on a difference between the first set of positions and the second set of positions.

20 Claims, 5 Drawing Sheets

(51) Int. Cl.
*C09K 11/02* (2006.01)
*G01L 1/16* (2006.01)
*G01L 1/24* (2006.01)

(52) U.S. Cl.
CPC ............ H01L 21/67288 (2013.01); *G06T 2207/30148* (2013.01); *G06T 2207/30152* (2013.01)

(56) References Cited

U.S. PATENT DOCUMENTS

| | | | | |
|---|---|---|---|---|
| 5,446,334 | A * | 8/1995 | Gaffney | H01L 41/1132 310/338 |
| 5,817,945 | A * | 10/1998 | Morris | G01L 1/24 73/800 |
| 6,031,611 | A | 2/2000 | Rosakis et al. | |
| 6,924,497 | B2 | 8/2005 | Suresh et al. | |
| 8,332,803 | B1 * | 12/2012 | Rahman | G06F 30/398 716/136 |
| 2001/0017059 | A1 * | 8/2001 | Xu | G01L 1/24 73/800 |
| 2004/0189972 | A1 * | 9/2004 | Mulkens | G03F 7/70558 355/71 |
| 2008/0144001 | A1 | 6/2008 | Heeg et al. | |
| 2009/0286076 | A1 * | 11/2009 | Xu | G01L 1/247 428/339 |
| 2013/0082191 | A1 * | 4/2013 | Raghavan | C09K 11/02 250/459.1 |
| 2014/0328369 | A1 * | 11/2014 | Flinn | G01N 21/71 374/57 |
| 2018/0224341 | A1 * | 8/2018 | Sakamoto | G01N 3/068 |

OTHER PUBLICATIONS

Xin Jin et al., A novel concept for self-reporting materials: stress sensitive photoluminescence in zno tetrapod filled elastomers (https://onlinelibrary.wiley.com/doi/abs/10.1002/adma.201203849), published Nov. 29, 2012.

* cited by examiner

VISUALIZING AND MODELING THERMOMECHANICAL STRESS USING PHOTOLUMINESCENCE

TECHNICAL FIELD

The present specification generally relates to systems and methods for detecting thermomechanical stress on semiconductor chips and, more specifically, to systems and methods for visualizing and modeling thermomechanical stresses on semiconductor chips using photoluminescence.

BACKGROUND

Operation of semiconductors in power electronics assemblies in electrified vehicles and other high heat environments can generate large heat flux. Due to the dissimilar coefficient of thermal expansion between various layers of a power electronics assembly, one or more layers of the assembly may flex due to the thermomechanical stresses. This movement may cause the semiconductor chip to crack or otherwise become damaged.

Accordingly, a need exists for alternative systems and methods for measuring thermomechanical stresses created during operation of semiconductors in power electronics assemblies.

SUMMARY

In one embodiment, an electronics system includes a substrate, an electronic device bonded to the substrate, a plurality of photoluminescent particles disposed on the electronic device, an illuminator, a sensor, and a control module. The illuminator illuminates the electronic device. The sensor captures a first set of positions of the photoluminescent particles on the electronic device when the electronic device is not operating under a load and a second set of positions of the photoluminescent particles when the electronic device is operating under a load. The control module determines thermomechanical stress on the electronic device based at least in part on a difference between the first set of positions and the second set of positions.

In another embodiment, a method includes depositing a plurality of photoluminescent particles on a surface of an electronic device bonded to a substrate, illuminating the surface of the electronic device with light at a first wavelength when the electronic device is not operating under load and determining a first set of positions of the photoluminescent particles on the electronic device, illuminating the surface of the electronic device with light at the first wavelength when the electronic device is operating under load and determining a second set of positions of the photoluminescent particles on the electronic device, and determining thermomechanical stress on the electronic device based at least in part on a difference between the first set of positions and the second set of positions.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
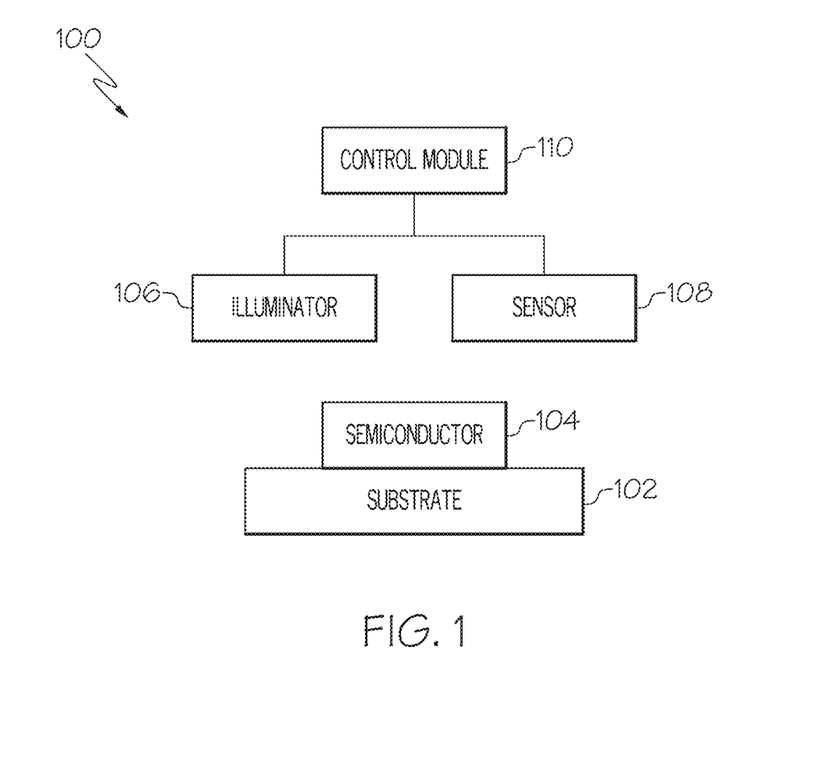
FIG. 1 schematically depicts a view of an example electronics system according to one or more embodiments shown or described herein.

FIG. 1 generally depicts one embodiment of an electronics system. The electronics system of FIG. 1 comprises an electronic device bonded to a substrate, an illuminator, a sensor, and a control module. A plurality of photoluminescent particles are disposed on the electronic device. The illuminator can illuminate the electronic device to cause the photoluminescent particles to illuminate such that the sensor can capture their position. During operation of the electronics system, thermomechanical stresses can cause the electronic device to fatigue and eventually fail due to cracking and/or delamination of the solder bond between the electronic device and the substrate.

The systems and methods disclosed herein allow for real-time visualization of the stresses on the electronic device, which allow for the detection of cracks in the electronic device and/or delamination between the electronic device and a substrate while the electronic device is in operation. By detecting these problems in real-time, corrective action can be taken before the problem becomes too severe.

The presence of the photoluminescent particles on the electronic device allows the thermomechanical stresses on the electronic device to be monitored in real-time, as described herein. When the electronic device is operating under load, the illuminator illuminates the photoluminescent particles causing them to luminescence and allowing the sensor to track their movement. The movement of the particles can then be used to monitor the thermomechanical load on the electronic device such that corrective action can be taken if necessary before significant damage occurs.

Referring now to FIG. 1, one embodiment of an electronics system 100 is illustrated. The electronics system 100 generally comprises a substrate 102, an electronic device 104 bonded to the substrate 102, an illuminator 106, a sensor 108, and a control module 110.

The substrate 102 is the base upon which the electronic device 104 is bonded, and may be any suitable substrate. Non-limiting examples include copper, direct-bonded copper, a metal-inverse opal layer, and the like. In some embodiments, the electronic device 104 is a semiconductor that is part of a power control unit in an electrified vehicle that switches on and off to convert DC voltage into AC voltage. In other embodiments, the electronic device 104 can be an electronic component other than a semiconductor and can be used in other environments and as part of other electronic systems for other purposes.

Figure 2A:
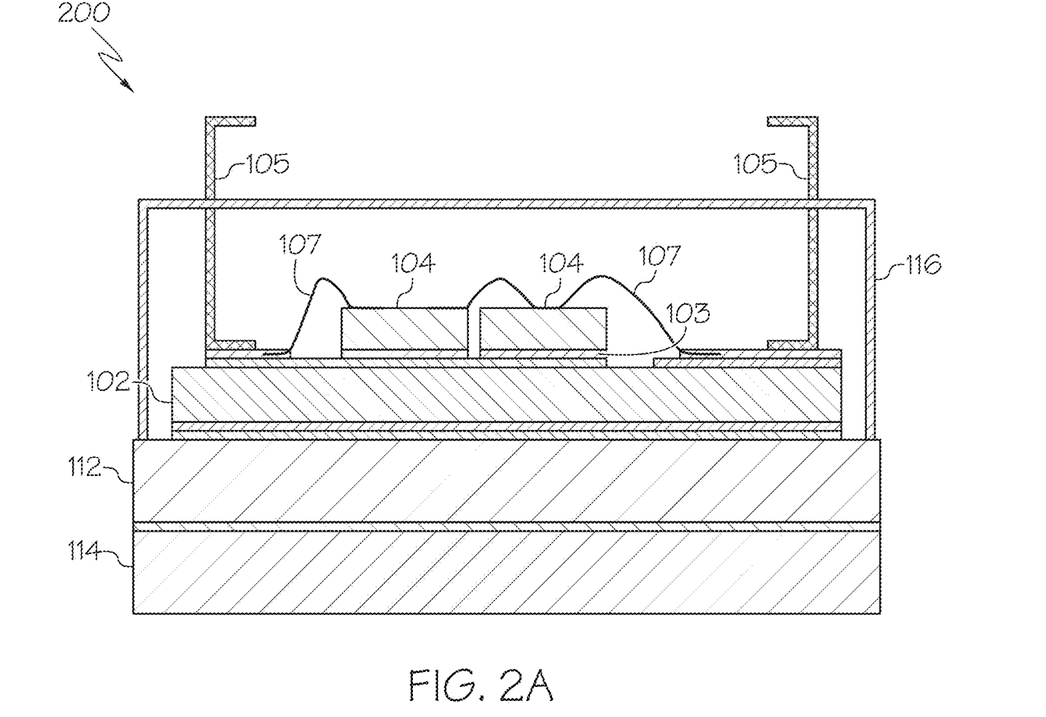
FIG. 2A schematically depicts a view of another example electronics system according to one or more embodiments shown or described herein.

Referring to FIG. 2A, another example electronics system 200 is illustrated. In the non-limiting example of FIG. 2A, the electronics system 200 comprises the substrate 102 of FIG. 1 and two electronic devices 104 of FIG. 1 bonded to the substrate 102. The devices 104 are bonded to the substrate 102 with a solder layer 103. The devices 104 may be connected to a bus bar 105 via wires 107. The bus bar 105 electrically couples the devices 104 to other components in a power electronics assembly. In addition, the electronics system 200 comprises a baseplate 112 and a heat sink 114. The baseplate 112 may form the base for the substrate 102, and may be any suitable material, such as copper, aluminum, and the like. The heat sink 114 may be used to cool the substrate 102 and the electronic device 104. The electronics system 200 is enclosed within a case 116.

Figure 2B:
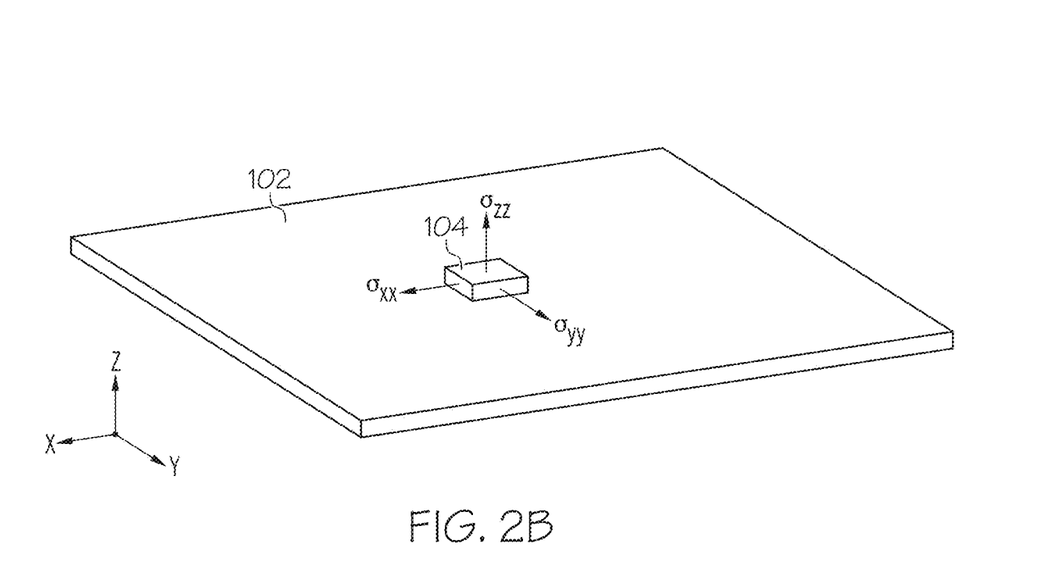
FIG. 2B shows a perspective view of a portion of the electronics system of FIG. 2A.

FIG. 2B shows a perspective view of the substrate 102 and the electronic device 104 bonded to the substrate 102. As the electronic device 104 is operated under load, a large amount of heat can be generated. Differences between the coefficient of thermal expansion of the substrate 102 and the coefficient of thermal expansion of the electronic device 104 can cause thermomechanical stress to be applied to the electronic device 104. This can cause portions of the electronic device 104 to expand or contract (e.g., flex) in the x and/or y directions as illustrated in FIG. 2B. As explained above, this can cause damage to the electronic device 104.

Figure 2C:
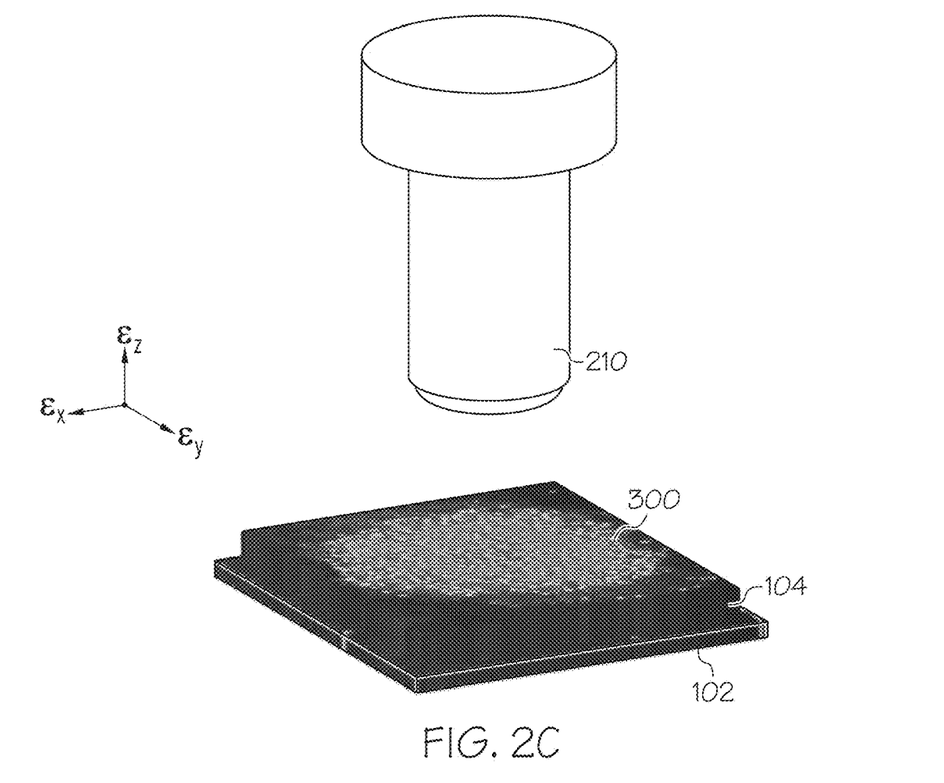
FIG. 2C shows a perspective view of a portion of the electronics system of FIG. 2A.

To visualize the expansion or contraction of the electronic device 104, a plurality of photoluminescent particles 300 are deposited on the surface of the electronic device 104 as shown in FIG. 2C. The particles 300 have the property of photoluminescence such that when they are illuminated with light at a particular wavelength (an excitation wavelength), they emit light at another wavelength (an emission wavelength).

In some embodiments, the photoluminescent particles 300 are phosphors that mit visible light when they are illuminated with ultraviolet light (i.e., the excitation wavelength of the particles 300 is in the ultraviolet portion of the electromagnetic spectrum and the emission wavelength of the particles 300 is in the visible portion of the electromagnetic spectrum). More particularly, in some embodiments, the photoluminescent particles 300 have an excitation wavelength of between about 345-350 nm and an emission wavelength between about 530-540 nm. It should be understood that the particles 300 may have other excitation and emission wavelengths in other portions of the electromagnetic spectrum.

Phosphors are particularly desirable for use in the electronics system 100 as described herein because they are stable at high temperatures. However, in other embodiments, the particles 300 may comprise other materials such as aggregated quantum dots or other photochromic materials so long as the materials have appropriate photoluminescent properties.

Figure 4:
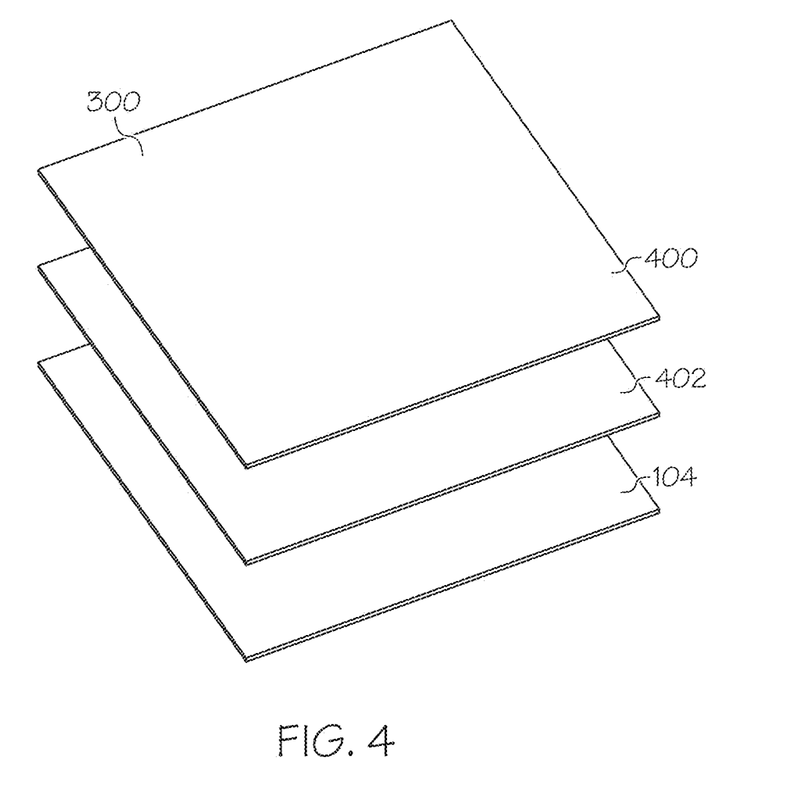
FIG. 4 schematically depicts an arrangement of layers in the electronics system of FIG. 1.

The photoluminescent particles 300 may have a particle size (e.g., a particle diameter) ranging from 220 nm (the approximate human visual limit) to 20 microns. In a non-limiting example, the photoluminescent particles 300 have a particle size of between 5-15 microns. In some embodiments, the particles 300 are deposited on the surface of the electronic device 104 using a spray-paintable clear coat. In other embodiments, other methods may be used to deposit the particles 300 onto the surface of the electronic device 104. Referring to FIG. 4, in some embodiments, the photoluminescent particles 300 are provided in a particulate layer 400 that is adhered to the electronic device 104 by a binder layer 402.

Figure 3A:
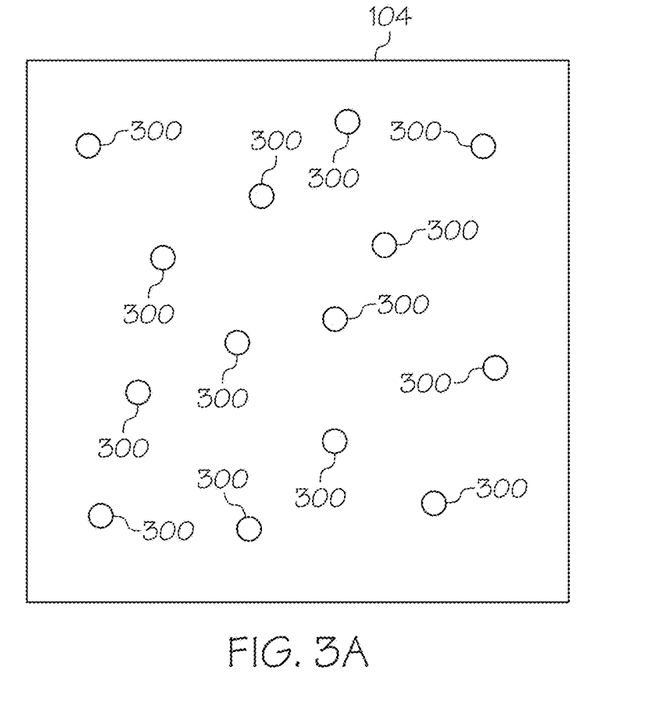
FIG. 3A shows an example arrangement of photoluminescent particles on a substrate in the electronics system of FIG. 1.

Referring now to FIG. 3A, a surface of the electronic device 104 has a plurality of photoluminescent particles 300 disposed on its surface. In some embodiments, the photoluminescent particles 300 are arranged on the surface of the substrate 102 in a predetermined pattern. In other embodiments, the photoluminescent particles 300 are arranged on the surface of the substrate 102 in a random pattern.

Figure 3B:
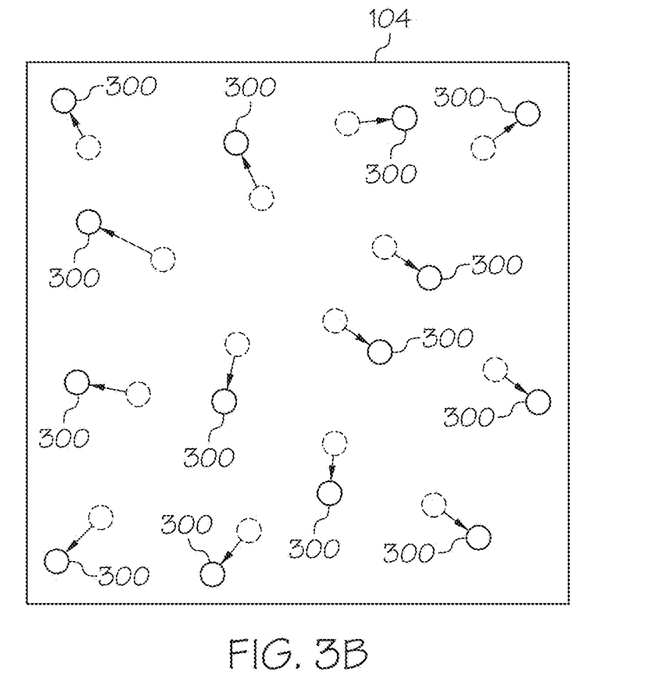
FIG. 3B shows an example movement of photoluminescent particles on a substrate in the electronics system of FIG. 1.

As the electronic device 104 is operated under load and heats up, it is subjected to thermomechanical stress, which causes the electronic device 104 to flex, the photoluminescent particles 300 on the surface of the electronic device 104 will move as the electronic device 104 flexes. FIG. 3B shows an example where the photoluminescent particles 300 have moved from their initial starting positions of FIG. 3A (illustrated with dashed lines in FIG. 3B) to new positions. By monitoring the movement of the photoluminescent particles 300 while the electronic device 104 is operating under a load, the thermomechanical stresses on the electronic device 104 can be monitored in real time.

Referring back to FIG. 1, the illuminator 106 is positioned above the electronic device 104. The illuminator 106 illuminates the surface of the electronic device 104 with light at the excitation wavelength of the photoluminescent particles 300. This triggers luminescence of the particles 300 such that they are viewable by the sensor 108. The illuminator 106 may comprise a light-emitting diode, a laser, or any other light source capable of illuminating the surface of the electronic device 104 with light at the excitation wavelength of the photoluminescent particles 300.

Still referring to FIG. 1, the sensor 108 is positioned above the electronic device 104. The sensor 108 captures an image of the photoluminescent particles 300 as they luminesce. That is, the sensor 108 captures light emitted by the photoluminescent particles 300 at their emission wavelength. In some embodiments, the sensor 108 is a color camera. In other embodiments, the sensor 108 is a black-and-white camera. In still other embodiments, the sensor 108 may be another device that is configured to capture an image of the photoluminescent particles 300 as they emit light at their emission wavelength.

As shown in FIG. 1, the illuminator 106 and the sensor 108 are slightly offset from the electronic device 104 in the horizontal direction. In some embodiments, the illuminator 106 or the sensor 108 may be positioned directly above the electronic device 104. If either the illuminator 106 or the sensor 108 are offset from the electronic device 104, the illuminator 106 or the sensor 108 may be angled such that they are pointed at the surface of the electronic device 104.

Figure 2D:
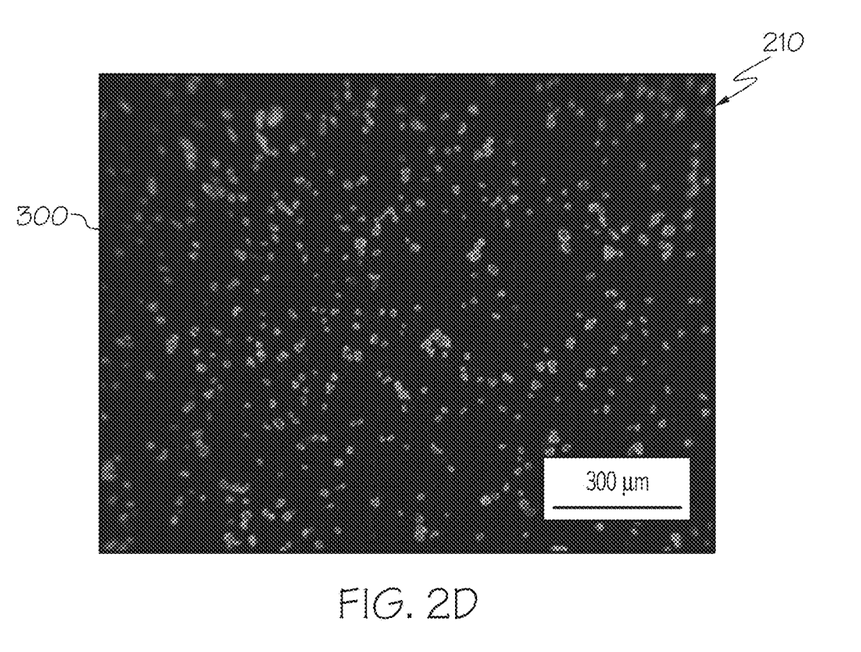
FIG. 2D shows an example image captured of the substrate of FIG. 2C.

In some embodiments, the illuminator 106 and the sensor 108 comprise a single device that both luminates the photoluminescent particles 300 with light at their excitation wavelength and captures an image of the particles 300 as they emit light at their emission wavelength. FIG. 2C shows an example device 210 positioned directly above the electronic device 104 that operates as both an illuminator and a sensor. FIG. 2D shows an example image 220 of the photoluminescent particles 300 present on the surface of the electronic device 104 and captured by the sensor 108. In the example of FIG. 2D, the particles 300 have a particle size of 300 microns.

Referring back to FIG. 1, the control module 110 controls the operation of the illuminator 106 and the sensor 108 and determines thermomechanical stress on the electronic device 104 based on the images captured by the sensor 108, as explained in further detail herein. The control module 110 may comprise a computer. In some embodiments, the control module 110 determines thermomechanical stress on the electronic device 104 by monitoring the movement of the photoluminescent particles 300 on the surface of the electronic device 104 while the electronic device 104 operates under load.

In operation, the photoluminescent particles 300 are deposited on the surface of the electronic device 104 while the electronics system 100 is not operating under load. The illuminator 106 then illuminates the surface of the electronic device 104 and the sensor 108 captures an image of the surface of the electronic device 104. This image will show the initial positions of the photoluminescent particles 300 on the surface of the electronic device 104. This may be used as a baseline to compare against images taken of the surface of the electronic device 104 when it is operating under load, as explained in further detail below.

Once the sensor 108 captures an image of the electronic device 104 showing the initial positions of the photoluminescent particles 300 on the surface of the electronic device 104, the control module 110 stores this image and/or these initial positions. The electronic device 104 is then operated under load. While the electronic device 104 is operated under load, the system 100 monitors the movement of the particles 300 by continually or periodically illuminating the surface of the electronic device 104 with the illuminator 106 and capturing an image of the electronic device 104 with the sensor 108 (e.g., periodically capturing an image with a set time interval between each image capture).

As the electronic device 104 expands or contracts due to thermomechanical stress, the photoluminescent particles 300 will move from their initial positions as explained above and illustrated in FIG. 3B. In particular, the particles 300 at locations on the surface of the electronic device 104 that expand or contract will move along with that portion of the electronic device 104. Thus, the movement of particular particles 300 corresponds to an expansion or contraction of particular portions of the electronic device 104. By visualizing the movement of the particles 300 on the surface of the electronic device 104, the stresses on the electronic device 104 may be visualized. The greater the displacement of any of the particles 300 from their initial positions, the greater the stress on the electronic device 104 at the locations of those particles. Thus, by comparing the initial positions of the particles 300 when the electronic device 104 is not operating under load (e.g., the positions shown in FIG. 3A) to the positions of the particles 300 when the electronic device 104 is operating under load (e.g., the positions shown in FIG. 3B), the control module 110 can create a strain map such as the example strain map 500, shown in FIG. 5. The strain map 500 is a heat map that plots the amount of displacement of each of the particles 300 along the surface of the electronic device 104. Thus, the strain map 500 shows the amount of strain at each location on the electronic device 104.

Figure 5:
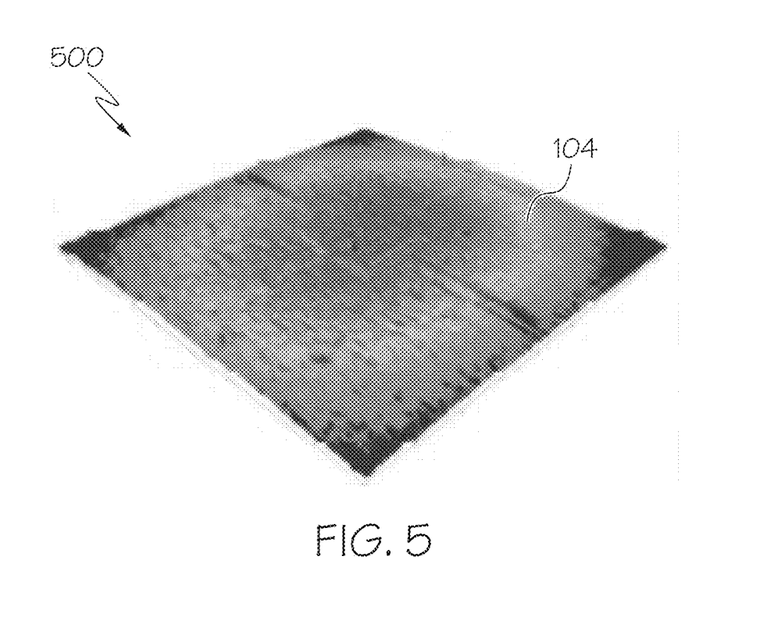
FIG. 5 shows an example strain map of a semiconductor chip in the electronics system of FIG. 1.

Once a strain map is created for the electronic device 104, the control module 110 converts the strain map to a stress map, which shows the amount of stress at each location on the electronic device 104. In a non-limiting example, the control module 110 converts the strain map to a stress map using a linear elastic model of the surface of the electronic device 104. A linear elastic model of the surface of the electronic device 104 determines the expected dislocation of the particles 300 on the surface of the electronic device 104 when the electronic device 104 is operating under load. The expected dislocation of the particles 300 can be used as a reference data set. Then, if the actual dislocation of the particles 300 is greater than the expected amount from the reference data, this indicates that there is poor adhesion between the electronic device 104 and the substrate 102 due to, for example, damage to the solder layer between the substrate 102 and the electronic device 104. Poor adhesion can cause the solder to expand more than the substrate 102 when subject to high temperatures. Thus, the dislocation of the particles 300 on the surface of the electronic device 104 can be correlated to damage to the surface of the electronic device 104.

A variety of open source software may be used to perform the above analysis to convert a strain map to a stress map such as, for example, NI-CORR and Open FTM. In some embodiments, the control module 110 converts a strain map to a stress map without comparing the actual displacement of particles 300 to reference data set. In these embodiments, the control module 110 uses well known properties of the materials comprising the substrate 102 and the electronic device 104 to determine expected displacement of the particles 300 during operation of the electronic device 104. These known material properties allow the control module 110 to determine certain expected behavior of the particles 300 assuming uniform adhesion between the substrate 102 and the electronic device 104. A stress map is then created based on differences between this expected behavior and the actual measured dislocation of the particles 300 while the electronic device 104 is operating under load.

In some embodiments, in addition to being photoluminescent, the particles 300 also have the property of thermoluminescence such that the intensity of light they emit while being illuminated by light at their emission wavelength changes in response to their temperature. In these embodiments, if a solder layer between the substrate 102 and the electronic device 104 is damaged, then in the areas where there is damage there will not be effective heat transfer from the electronic device 104 to the substrate 102 and to a cooling surface underneath the substrate 102, such as the heat sink 114. This can cause pockets of high temperature regions to be formed on the electronic device 104. In embodiments where the particles 300 have thermoluminescence, the particles 300 will emit light more brightly in areas where there is a significant temperature difference between the substrate 102 and the electronic device 104.

In embodiments where the particles 300 exhibit thermoluminescence as described above, the illuminator 106 illuminates the surface of the electronic device 104 and the sensor 108 measures the intensity of luminescence of the particles 300 when the electronic device 104 is not operating under load. This may be used as a baseline luminescent intensity of the particles 300. Then, while the electronic device 104 is operating under load, the illuminator 106 again illuminates the surface of the electronic device 104 and the sensor 108 measures the intensity of the luminescence of the particles. The control module 110 then compares the measured intensities of the photoluminescent particles 300 while the electronic device 104 is operating under load to the baseline luminescent intensity to create a strain map based on the difference at each location on the surface of the electronic device 104. The strain map may be converted to a stress map using the techniques described above. In some embodiments, the control module 110 uses the above described method of monitoring the displacement of the particles 300 in combination with the method of monitoring the photoluminescent intensity of the particles 300 to determine damage to the electronic device 104.

In some embodiments, the wavelength of photoluminescent emission of the particles 300 changes when the particles 300 are subjected to a change in temperature. In these embodiments, the sensor 108 detects the change in the wavelength of luminescent emission by the particles 300 (e.g., the sensor may be a color camera), and the control module 110 creates a strain map of the electronic device 104 based at least in part on this change in wavelength. The strain map may then be converted to a stress map using the techniques described above.

It should now be understood that embodiments described herein allow thermomechanical stresses on electronic devices in power electronics assemblies to be visualized and monitored in real-time by tracking the movement of photoluminescent particles on the surface of electronic devices. By monitoring these stresses while an electronic device operates under load, corrective action can be taken before significant damage to the device occurs.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. An electronics system comprising:
   a substrate;
   an electronic device bonded to the substrate;
   a plurality of photoluminescent particles disposed on the electronic device;
   an illuminator to illuminate the electronic device;
   a sensor to capture a first set of positions of the photoluminescent particles on the electronic device when the electronic device is not operating under a load and a second set of positions of the photoluminescent particles when the electronic device is operating under a load; and
   a control module to determine thermomechanical stress on the electronic device based at least in part on a difference between the first set of positions and the second set of positions.

2. The electronics system of claim 1, wherein the photoluminescent particles emit visible light when the photoluminescent particles are illuminated with ultraviolet light by the illuminator.

3. The electronics system of claim 1, wherein the photoluminescent particles comprise phosphor particles.

4. The electronics system of claim 1, wherein the substrate is bonded to a baseplate.

5. The electronics system of claim 1, wherein the photoluminescent particles are arranged in a predetermined pattern.

6. The electronics system of claim 1, wherein the photoluminescent particles are arranged in a random pattern.

7. The electronics system of claim 1, wherein the control module determines delamination between the substrate and the electronic device based at least in part on the difference between the first set of positions and the second set of positions.

8. The electronics system of claim 1, wherein the control module determines a strain map of the electronic device based at least in part on the difference between the first set of positions and the second set of positions.

9. The electronics system of claim 8, wherein the control module converts the strain map to a stress map of the electronic device.

10. The electronics system of claim 9, wherein the control module converts the strain map to a stress map based on a linear elastic model of a surface of the electronic device.

11. The electronics system of claim 1, wherein the sensor detects intensities of luminescence of a plurality of the photoluminescent particles and the control module determines thermomechanical stress on the electronic device based at least in part on the detected intensities.

12. The electronics system of claim 1, wherein the sensor detects wavelengths of photoluminescent emissions of a plurality of the photoluminescent particles and the control module determines thermomechanical stress on the electronic device based at least in part on the detected wavelengths of photoluminescent emissions.

13. A method comprising:
   depositing a plurality of photoluminescent particles on a surface of an electronic device bonded to a substrate;
   illuminating the surface of the electronic device with light at a first wavelength when the electronic device is not operating under load and determining a first set of positions of the photoluminescent particles on the electronic device;
   illuminating the surface of the electronic device with light at the first wavelength when the electronic device is operating under load and determining a second set of positions of the photoluminescent particles on the electronic device; and
   determining thermomechanical stress on the electronic device based at least in part on a difference between the first set of positions and the second set of positions.

14. The method of claim 13, wherein determining the positions of the photoluminescent particles while the surface of the electronic device is being illuminated with light at the first wavelength comprises capturing an image of the electronic device with a sensor that can detect light at a second wavelength, wherein the photoluminescent particles emit light at the second wavelength when the photoluminescent particles are illuminated with light at the first wavelength.

15. The method of claim 13, wherein the plurality of photoluminescent particles are deposited on the surface of the electronic device in a predetermined pattern.

16. The method of claim 13, further comprising determining a strain map of the electronic device based at least in part on the difference between the first set of positions and the second set of positions.

17. The method of claim 16, further comprising converting the strain map to a stress map of the electronic device.

18. The method of claim 17, further comprising converting the strain map to a stress map based on a linear elastic model of the surface of the electronic device.

19. The method of claim 13, further comprising:
   determining a first set of intensities of luminescence of the photoluminescent particles while the particles are being illuminated with light at the first wavelength and the electronic device is not operating under a load;

determining a second set of intensities of luminescence of the photoluminescent particles while the particles are being illuminated with light at the first wavelength and the electronic device is operating under a load; and determining thermomechanical stress on the electronic device based at least in part on a difference between the first set of intensities and the second set of intensities.

20. The method of claim 13, further comprising:

determining a first set of wavelengths of luminescence of the photoluminescent particles while the particles are being illuminated with light at the first wavelength and the electronic device is not operating under a load;

determining a second set of wavelengths of luminescence of the photoluminescent particles while the particles are being illuminated with light at the first wavelength and the electronic device is operating under a load; and determining thermomechanical stress on the electronic device based at least in part on a difference between the first set of wavelengths and the second set of wavelengths.

\* \* \* \* \*

UNITED STATES PATENT AND TRADEMARK OFFICE
CERTIFICATE OF CORRECTION

PATENT NO. : 11,386,544 B2
APPLICATION NO. : 16/668604
DATED : July 12, 2022
INVENTOR(S) : Shailesh N. Joshi et al.

It is certified that error appears in the above-identified patent and that said Letters Patent is hereby corrected as shown below:

On the Title Page

Item (73), Assignee, delete "TOYOTA MOTOR ENGINEEEING & MANUFACTURING NORTH AMERICA, INC." and insert --The Ohio State University, Columbus, OH (US)--, therefor.

In page 2, Column 2, Item (56), U.S. patent documents, cite no. 4, delete "Xu" and insert --Xu et al.--, therefor.

In page 2, Column 2, Item (56), U.S. patent documents, cite no. 5, delete "Raghavan" and insert --Raghavan et al.--, therefor.

In the Specification

In Column 3, Line(s) 43, delete "mit" and insert --emit--, therefor.

Signed and Sealed this
Eleventh Day of October, 2022

*Katherine Kelly Vidal*

Katherine Kelly Vidal
*Director of the United States Patent and Trademark Office*